_(12)_ United States Patent
Jourdan et al.

(10) Patent No.: US 10,868,511 B2
(45) Date of Patent: Dec. 15, 2020

(54) MICROELECTRONIC STRUCTURE COMPRISING MEANS OF CONTROL OF VISCOUS DAMPING

(71) Applicants: COMMISSARIAT A L'ENERGIE ATOMIQUE ET AUX ENERGIES ALTERNATIVES, Paris (FR); SAFRAN ELECTRONICS & DEFENSE, Boulogne-Billancourt (FR)

(72) Inventors: Guillaume Jourdan, Grenoble (FR); Guillaume Lehee, Boulogne-Billancourt (FR)

(73) Assignees: COMMISSARIAT A L'ENERGIE ATOMIQUE ET AUX ENERGIES ALTERNATIVES, Paris (FR); SAFRAN ELECTRONICS & DEFENSE, Boulogne-Billancourt (FR)

( * ) Notice: Subject to any disclaimer, the term of this patent is extended or adjusted under 35 U.S.C. 154(b) by 445 days.

(21) Appl. No.: 15/850,453

(22) Filed: Dec. 21, 2017

(65) Prior Publication Data

US 2018/0183404 A1 Jun. 28, 2018

(30) Foreign Application Priority Data

Dec. 22, 2016 (FR) ...................................... 16 63258

(51) Int. Cl.
*H01L 41/04* (2006.01)
*H03H 9/02* (2006.01)
(Continued)

(52) U.S. Cl.
CPC ....... *H03H 9/02448* (2013.01); *B81B 3/0045* (2013.01); *G01P 15/003* (2013.01);
(Continued)

(58) Field of Classification Search
CPC ............ H03H 9/02448; H03H 3/0072; H03H 9/02338; H03H 9/2452;
(Continued)

(56) References Cited

U.S. PATENT DOCUMENTS

| 6,675,578 B1* | 1/2004 | Sinclair ................. B81B 3/0051 310/307 |
| 2018/0327253 A1* | 11/2018 | Jourdan ............. G02B 26/0841 |

OTHER PUBLICATIONS

U.S. Appl. No. 14/519,390, filed Oct. 21, 2014, 2015/0107357 A1, Sébastien Hentz et al.

(Continued)

*Primary Examiner* — Thomas M Dougherty
(74) *Attorney, Agent, or Firm* — Oblon, McClelland, Maier & Neustadt, L.L.P.

(57) ABSTRACT

Microelectronic structure comprising a mobile mass mechanically linked to a first and to a second mechanical element by first and second mechanical linking device respectively, a polarisation source for the second mechanical linking device. The second mechanical linking means comprises two linking elements and a thermal reservoir placed between the linking elements, where at least one of the linking elements is made of piezoresistive material, where at least one of the first and second linking elements exhibit thermoelasticity properties. The thermal reservoir exhibits a thermal capacity which is different from those of the linking elements. The second linking device and the mobile mass are arranged relative to each other such that displacement of the mobile mass applies a mechanical stress to the second linking means.

17 Claims, 5 Drawing Sheets

(51) Int. Cl.
*G01P 15/00* (2006.01)
*B81B 3/00* (2006.01)
*H03H 3/007* (2006.01)
*H03H 9/24* (2006.01)
*G01P 15/08* (2006.01)

(52) U.S. Cl.
CPC ...... *H03H 3/0072* (2013.01); *H03H 9/02338* (2013.01); *H03H 9/2452* (2013.01); *B81B 2201/0235* (2013.01); *B81B 2201/0242* (2013.01); *B81B 2201/0271* (2013.01); *G01P 15/0802* (2013.01); *G01P 2015/0882* (2013.01); *H03H 2009/02307* (2013.01)

(58) Field of Classification Search
CPC ........ H03H 2009/02307; B81B 3/0045; B81B 2201/0235; B81B 2201/0242; B81B 2201/0271; G01P 15/003; G01P 15/0802; G01P 2015/0882
USPC .......................................... 310/311–371, 800
See application file for complete search history.

(56) References Cited

OTHER PUBLICATIONS

U.S. Appl. No. 15/248,756, filed Aug. 26, 2016, 2017/0059420 A1, Patrice Rey et al.
U.S. Appl. No. 15/297,243, filed Oct. 19, 2016, 2017/0117825 A1, Guillaume Jourdan et al.
U.S. Appl. No. 15/499,292, filed Apr. 27, 2017, 2017/0314973 A1, Luca Leoncino et al.
U.S. Appl. No. 15/735,441, filed Jun. 10, 2016.
French Preliminary Search Report dated Aug. 28, 2017 in French Application 16 63258 filed on Dec. 22, 2016 (with English Translation of Categories of Cited Documents).
Guillaume Lehee et al. "Low Power Damping Control of a Resonant Sensor Using Back Action in Silicon Nanowires," IEEE 29$^{th}$ International Conference on MEMS 2016, Shanghai, China, Jan. 2016, pp. 4.
Mikail Yucetas et al.: "A Charge Balancing Accelerometer Interface with Electrostatic Damping," Proceedings of the ESSCIRC (ESSCIRC), IEEE, 2011, pp. 4.

* cited by examiner

MICROELECTRONIC STRUCTURE COMPRISING MEANS OF CONTROL OF VISCOUS DAMPING

TECHNICAL FIELD AND STATE OF THE PRIOR ART

The present invention relates to microelectromechanical structures and/or nanoelectromechanical structures with controlled viscous damping.

Microelectromechanical systems (MEMS) and nanoelectromechanical systems (NEMS) comprise a fixed part and at least one mass which is mobile relative to a substrate, capable of being made to vibrate due to the action of an external stimulus, forming a resonator.

A mechanical resonator or oscillator arranged in a gaseous environment undergoes damping due to friction with gas during the movement of the mobile mass, called viscous damping.

The control over the damping process or over dissipation of mechanical energy in a resonator allows the passband of the MEMS and NEMS to be increased by reducing the time interval required to find the balance with the external medium. More generally, control of the bandwidth of a mechanical resonator can be used to create tuneable band-pass filters. Finally the compensation of viscous damping forces, via such a control, can lead the system to become to self-oscillating. This property can be used to create electromechanical oscillators Control of viscous damping constitutes an effective means of modifying the electromechanical response of a MEMS/NEMS structure: the mechanical behaviour of a microsystem subjected to an external stimulus can be fundamentally redefined whether in terms of response time to reach its stationary regime, of sensitivity to disturbances close to the resonance frequency, or of capacity to create an auto-oscillating system.

Several solutions exist for modifying this viscous damping in which the resonator is located. Vibration modes which cause movements in interaction with air-streams are governed by pneumatic damping processes when they are placed in air: for example, bending beams, masses in translation. Close to ambient pressure the dissipation is very sensitive to the pressure level. At low pressures, on the other hand, where fewer molecules are present, the dissipation coefficient changes little. The quality factor of a MEMS may thus be controlled by the pressure level in a cavity wherein the mobile element is located, achieved for example by hermetic sealing. This solution does not provide dynamic control of the quality factor.

Furthermore it does not allow two MEMS structures located in the same cavities to be controlled independently. For example, the aim may be to co-integrate a device which requires a low quality factor, for example an accelerometer, and another device which in contrast needs a high quality factor, for example a gyrometer. Lowering the pressure in the cavity influences both quality factors.

Another solution involves performing active control of the damping process in a MEMS. To do this an external viscous damping force is generated. Such a force is generated using an actuator which is controlled by electronics, control of which is proportional to the speed of the mobile mechanical system. For example, this may be achieved by using means of detecting the movement of the MEMS/NEMS, a PID corrector (proportional, integral, derivative) and an actuator, together forming a closed loop. This solution is described, for example, in document Yücetaş M, Aaltonen L, Pulkkinen M, Salomaa J, Kalanti A, Halonen K. *A charge balancing accelerometer interface with electrostatic damping.* In: *ESSCIRC (ESSCIRC), 2011 Proceedings of the.* 2011. p. 291-4. A system which implements capacitive means of detection and actuation is described. Although highly effective, this solution requires the use of electronics outside the mechanical system as well as means for detecting movement of the MEMS/NEMS. This results in large overall dimensions for the electronics and high energy consumption, which limit the use of this configuration.

The document Lehee G, Souchon F, Riou J C, Bosseboeuf A, Jourdan G. "*Low power damping control of a resonant sensor using back action in silicon nanowires*". In: *2016 IEEE 29th International Conference on Micro Electro Mechanical Systems (MEMS).* 2016. p. 99-102 describes a solution which uses the back action effect in a thermo piezoresistive element (Thermo Piezoresistive Back Action or TPBA effect). It describes an oscillator which comprises a mobile mass capable of oscillating in rotation in the plane and nano-gauges formed by nano-beams between the mass and the substrate. Different positions of the nano-beams relative to the axis of the pivot were tested. The nano-gauges undergo compression or tension during the displacement of the mass. The nano-beams are made of silicon (SiNW) doped with boron. They are made of a piezoresistive and thermoelastic material.

The nano-beams are electrically polarised, they undergo self-heating $\Delta T = R_{th} P_j$ (I) which is proportional to the Joule power $P_j = RI^2$ where $R_{th}$ is the thermal resistance of the beam and R the electrical resistance of the beam.

As a result of the oscillation of the mass, the nano-beams of length L undergo elongation x.

This elongation results in a modification of the electrical resistance of the beam through the piezoresistivity effect:

$$\delta R = \pi_g R \frac{x}{L}.$$

The Joule power is modified in accordance with $\delta P = \delta R I^2$.

The temperature of the beams change to a new value, that is, a variation of $\delta T = R_{th} I^2 \delta R$ (II).

This results in a mechanical back-force produced by thermoelasticity: $F = E \alpha \delta T$ where E is Young's modulus for the component material of the nano-beams, and $\alpha$ is its coefficient of thermal expansion.

As a result, a force proportional to the movement of the MEMS structure is applied to the latter:

$$F = E \alpha R_{th} I^2 \pi_g R \frac{x}{L}$$

A delay effect may be induced by the resistance and thermal inertia of the nano-beams.

In effect a thermal time constant $\tau_{th} = R_{th} C_{th}$ appears as a result of the limitation of the flow of thermal energy between the system and the exterior. This time constant may be viewed as a delay in establishing a new temperature value. The temperature variation can be described by:

$$\delta T = R_{th} I^2 \delta R(t - \tau_{th}) \sim R_{th} I^2 (\delta R - \tau_{th} \delta \dot{R})$$

-continued $$F = E\alpha R_{th} I^2 \pi_g R \left( \frac{x}{L} - \tau_{th} \frac{\dot{x}}{L} \right)$$

The back-force produced by the measurement system then comprises a viscous term:

$$F_v = -\Gamma_{BA} \dot{x}$$

Where $$\Gamma_{BA} = \frac{\tau_{th} E\alpha R_{th} I^2 \pi_g R}{L}.$$

A more in-depth modeling of the problem shows that the harmonic response of the force in fact takes the form of:

$$F(\omega) = E\alpha R_{th} I^2 \pi_g R \frac{x - j\tau_{th}\dot{x}}{1 + (\omega\tau_{th})^2}$$

The dissipation force plays an important role close to the resonance frequency $\omega_r$ of the MEMS/NEMS mechanical system. The effect will therefore be at a maximum when the time constant reaches a value such that:

$$\tau_{th}\omega_r \sim 1$$

In effect the following limiting cases show:

$\tau_{th}\omega_r \ll 1$, the system adopts a temperature which at a given instant depends on the position of the MEMS/NEMS at the scale of the oscillation period.

$\tau_{th}\omega_r \gg 1$, the power modulation due to the movement produces a small temperature modulation of the improved TPBA structure. At the scale of the oscillation period the amount of thermal energy exchanged between the TPBA beam and the electrical circuit is greatly reduced: the small temperature modulation generates a thermoelastic force of small intensity.

The nano-beams exhibit high thermal resistance and low thermal capacity: as it stands it is not easy to exert independent control over the thermal time constant $\tau_{th}$ and the resonance frequency of the structure $\omega_r$, wherein they occur. Moreover the further the nano-beams are from the axis of the pivot the greater the resonance frequency.

As a result the TPBA effect is optimised when:
the stiffness of the beams governs the overall stiffness of the structure,
The thermal time-constant is close to the oscillation period $$\tau_{th} \approx \frac{T}{2\pi}.$$

In the above example, an optimum position of the gauges relative to the pivot is assumed.

These two conditions are not always compatible with each other and a compromise is made in the design dimensions of MEMS/NEMS structures.

DESCRIPTION OF THE INVENTION

One aim of the present invention is consequently to offer a microelectronic structure that comprises at least one mobile mass with controlled viscous damping, where optimisation of the damping is decoupled, at least to a large extent, from the resonance frequency of the structure.

The above-stated aim is achieved by a microelectronic structure comprising at least one mobile mass mechanically linked to at least one first mechanical element and a second distinct mechanical element by first and second linking means respectively, and a source of polarisation of current or voltage of the first mechanical linking means, where the first mechanical linking means comprises at least two linking elements and a thermal reservoir inserted between the two linking elements, where at least one of the linking elements is at least in part made of a piezoresistive materials and where at least one of the linking elements exhibits thermoelasticity properties. Moreover the thermal reservoir exhibits a thermal capacity which differs from those of the linking elements.

According to the invention, by using at least one piezoresistive linking element and at least one thermoelastic linking element, a back-action effect is produced, and a back force results from this which is applied to the mobile mass. By using a thermal reservoir the back force comprises a viscous damping term which is partly determined by the characteristics of the thermal reservoir. Thus by designing the dimensions of the thermal reservoir the viscous damping applied to the mobile mass can be maximised.

The inventors have determined that the thermal time constant $\tau_{th}$ which sets the delay in the dissipative force could be used as a means of designing the dimensions of the dissipative force, and that this time constant may be rendered more or less independent of the stiffness of the MEMS/NEMS structure.

Nevertheless, obtaining design dimensions for the value of $\tau_{th}$ is complex, in particular so that modifying it has no effect on the resonance frequency of the structure, since the time constant depends, amongst other things, on the geometry of the beam and on the dimensions of the mechanical elements it comes into contact with, which have an influence on the resonance frequency.

The inventors therefore designed linking means between the mobile mass and a mechanical element which comprise at least two linking elements linked together by a zone of thermal capacity which is different from that of the beams, where this zone has no or little influence on the stiffness of the linking element and therefore on the resonance frequency of the structure. The time constant may be set by the choice of this thermal capacity.

Thanks to the invention it is possible to control the viscous damping by setting the design dimensions of a thermal reservoir without using external electronics and means of detection. It is no longer necessary to control the atmosphere around the structure.

Moreover the present invention offers the possibility of simple adjustment of the dissipation factor of a resonator whilst retaining a constant force noise level.

Advantageously, the thermal capacity of the thermal reservoir is greater than the thermal capacity of the beams and is very advantageously equal to at least 5 times the greatest thermal capacity of the two linking elements.

In one embodiment example the first and second linking elements are beams.

The thermal reservoir may exhibit a greater thickness than that of the beams and/or a greater planar surface area.

The subject-matter of the present invention is therefore a microelectronic structure which comprises at least one mobile mass mechanically linked to at least one first mechanical element and a distinct second mechanical element by a first mechanical linking device and a second mechanical linking device respectively, a source of polarisation of current or voltage of the second mechanical linking device, wherein the second mechanical linking device comprises at least one first and one second linking elements and at least one thermal reservoir inserted between the first and second linking elements, at least one of the first and second linking elements being made at least in part of a piezoresistive material, at least one of the first and second linking elements exhibiting thermoelasticity properties, and the thermal reservoir exhibiting a thermal capacity which is different from those of the first and second linking elements, and wherein the second linking device and the mobile mass are arranged relative to each other such that a displacement of the mobile mass applies a mechanical stress to the second linking device.

According to the invention the second linking device exhibits properties which are both piezoresistive and thermoelastic. These properties are provided by one and/or the other of the linking elements. For example, only one of the linking elements exhibits piezoresistive and thermoelastic properties, or both linking elements exhibit these piezoresistive and thermoelastic properties or again one of the linking elements exhibits piezoresistive properties and the other linking element exhibits thermoelastic properties.

BRIEF DESCRIPTION OF THE DRAWINGS

The present invention will be better understood on the basis of the description which follows and the appended drawings, in which.

DETAILED DESCRIPTION OF PARTICULAR EMBODIMENTS

In the present application the term microelectronic structure refers to a structure comprising microelectromechanical elements and/or nanoelectromechanical elements.

Figure 1:
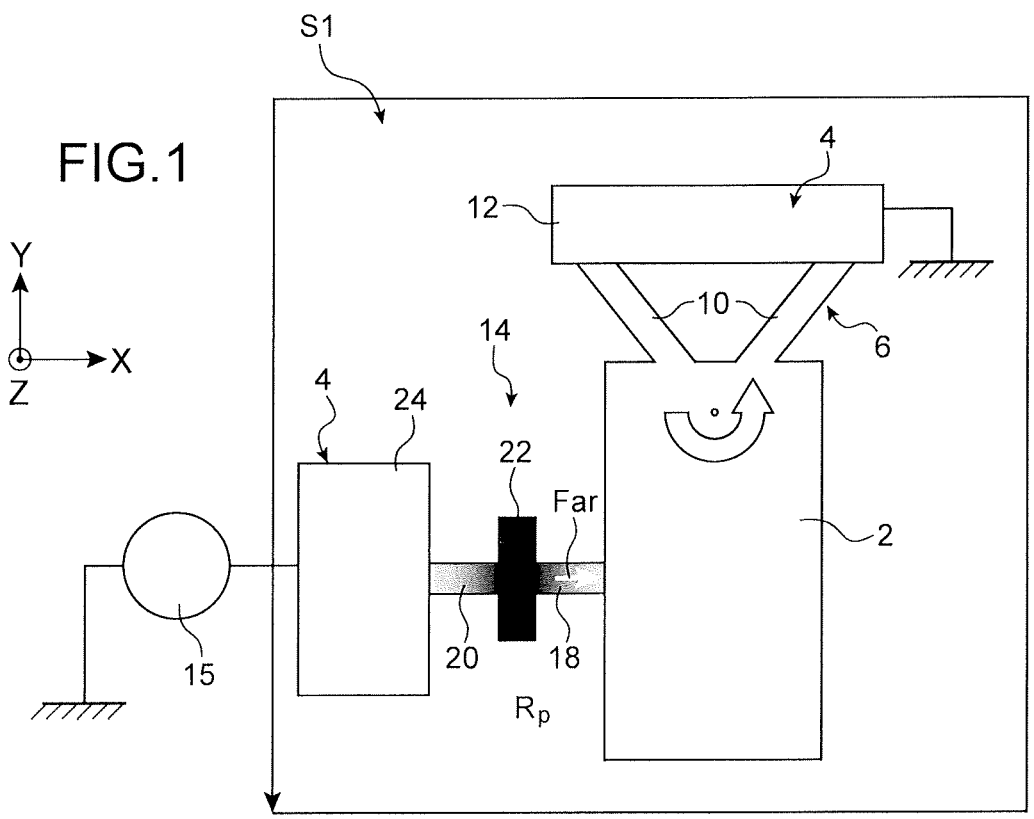
FIG. 1 is a schematic representation of an embodiment example of a microelectronic structure according to the invention.

In FIG. 1 an example of such a microelectronic structure 51 according to the invention can be seen. The structure extends along a mean plane P defined by the axes X and Y. The structure comprises a mobile mass 2 capable of movement relative to a support 4 formed for example by a substrate. The mobile mass 2 is linked to the support 4 by first linking means 6 such that they allow displacement of the mobile mass 2 relative to the support 4.

In the example shown, the first linking means 6 comprise a pivot linkage which exhibits a pivot axis Z orthogonal to the plane P. The mobile mass 2 is therefore capable of moving in rotation around the axis Z in the plane P. In the example shown, the pivot linkage comprises two beams 10 extend between an anchorage stud 12 and the mobile mass 2, where the beams 10 have secant axes at a point O which is the intersection of the Z axis and the plane P. The beams 10 deform in bending and allow the mass to rotate around Z. It will be understood that the pivot link may be made in another manner.

The structure comprises second linking means 14 between the mobile mass 2 and the support 4. The second linking means are electrically conductive. The structure also comprises means of polarisation 15 of current or voltage of these second linking means.

As will be described in the remainder of the description, the second linking means 14 are such that they exert a force on the mobile mass by thermo-piezoresistive back action. The second linking means 14 are then orientated relative to the first linking means 6, such that they are mechanically stressed by the mobile mass 2 in motion, and such that the back action force Far is applied at least in the direction along which the mass may move. In this example, the mobile mass 2 moves primarily along the direction X. The second linking means 14 are then such that they exert a back action force Far on the mass along the X axis.

The second linking means 14 are stressed by the mobile mass 2. These are preferably stressed under tension and under compression, whilst allowing bending movement superimposed over the compression or tension.

Figure 2:
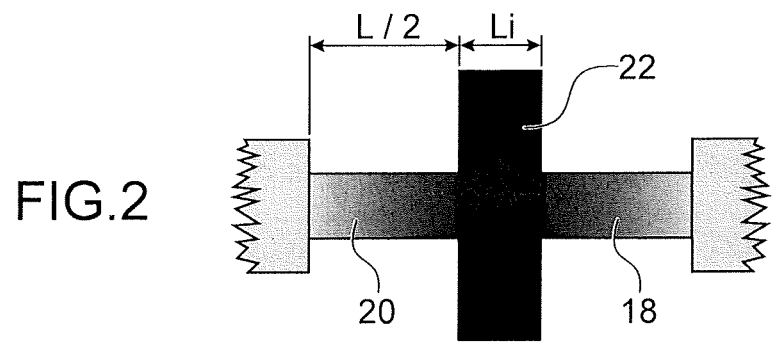
FIG. 2 is a detailed view of the structure in FIG. 1.

According to the invention, the second linking means 14 shown only in FIG. 2 comprise at least two linking elements 18, 20 linked by a thermal reservoir.

The linking element 18 is anchored to the mobile mass 2 and to the thermal reservoir 22 and the linking element 20 is anchored to the thermal reservoir 22 and to a second anchorage stud 24. The second linking means 14 are such that they are capable of exerting mechanical forces on the mobile mass 2. For this they exhibit a certain stiffness and their connection to the second anchorage stud is such that the force Far preferentially displaces the mobile mass. In this embodiment example, the second anchorage stud is not mobile.

The relative stiffness $k_e$ between the second anchorage stud and the anchorage of the first beam 18 to the mass 6 along each of the beam axes 18, 20 are preferably as close as possible to the smallest axial stiffness $k_p$ of the beams 18, 20, so that the forces generated by thermal expansion in at least one of the beams are applied to the anchorages instead of favouring the movement of the thermal reservoir.

Advantageously the structure is such that:

$$k_e > 0,1 k_p$$

The embodiment example of the second linking means shown in FIG. 1 is very favourable. When both beams have an axial stiffness $k_p$, the stiffness of the assembly of the second linking means along the axis of the beams is close to $k_p/2$.

In this example, advantageously, the first 18 and second 20 linking elements are rectilinear beams, where the one 18 is linked to the mobile mass 2 and to the thermal reservoir 22 by its longitudinal ends, and the other 20 is linked to the thermal reservoir 22 and to the second anchorage stud 24 by its longitudinal ends.

The two linking elements 18, 20 preferably have a large length value and a small transverse cross-section. The length of the linking elements is preferably 5 times greater than the transverse dimensions.

The beams 18 and 20 are preferably of identical or similar dimension, which enable both optimum mechanical stiffness of the second linking means and optimum thermal insulation of the thermal reservoir 22 to be achieved.

At least one of the linking elements 18, 20 is made of piezoresistive material, for example of silicon. Moreover at least one of the linking elements 18, 20 exhibits thermoelastic properties. For example, at least one of the materials is made from Si, Al, SiGe, SiN, $SiO_2$. In the case of $SiO_2$ and of SiN, a conductive track is made on the beam.

In the present application an element is considered to exhibit thermoelastic properties if it exhibits a coefficient of expansion at the working temperature which is greater than $10^{-7}K^{-1}$.

The thermal reservoir 22 is such that it exhibits a thermal capacity Cth which differs from the thermal capacities of the first 18 and second 20 linking elements. Cth is preferably greater than the thermal capacities of the linking elements, very advantageously greater than at least 5 times the thermal capacities of the linking elements. In the case where one of the linking elements exhibits a thermal capacity which is greater than that of the other linking element, Cth is greater than the highest thermal capacity and is advantageously 5 times greater than the latter.

Moreover the thermal reservoir 22 is such that the stiffness of the second linking means is modified only to a small extent relative to linking means without a reservoir, formed for example by a single beam.

For example the second linking means 14 are made from a single piece and made from the same material, for example from n or p doped Si, from AlSi, SiGe or from Au.

In this case the reservoir exhibits at least one cross-section orthogonal to the X axis of surface area greater than that of a cross-section of the beams 18 and 20. In the example shown, the thermal capacity Cth is obtained by creating a zone between beams 18 and 20 which has a greater surface area in the plan P. As a variant the reservoir could comprise the same dimensions as the beams in the plane P but larger dimension along the Z direction. In yet another variant the reservoir could comprise greater dimensions in the plane and in the Z direction to those of the beams, or smaller dimensions in the plane and a greater dimension in the Z direction or again greater dimensions in the plane P and a smaller dimension in the Z direction. As a variant the thermal reservoir may be made from a different material from that of the linking elements, and which exhibits a different thermal capacity to those of the materials of linking elements 18, 20, advantageously greater. For example the thermal reservoir could be made of an aluminium-based alloy, of beryllium, and the linking elements could be made of Si.

The thermal reservoir 22 could then have the same dimensions as the linking elements 18, 20, whilst exhibiting a greater thermal capacity since it would be made of a material with a greater thermal capacity or at the same time made of a material with a thermal capacity greater than that of the materials of the linking elements and of different dimensions.

It may be envisaged that the thermal reservoir comprises different materials. In the case where the thickness of the thermal reservoir is greater than that of the linking elements, for example the increased thickness may be achieved by the deposition of another material such as AlSi or Be.

The means of polarisation comprise a voltage or current generator linked to the anchorage studs. The mobile mass and the first linking means are then also electrical conductors or have tracks made from an electrically conductive material.

As a variant it is possible to envisage connecting the generator between the second anchorage stud and the end of the beam 18 anchored to the mobile mass. In order to do this, an electrical linking element may be introduced so as to be in contact with the anchorage located on the mobile part. This element may have the form of a coil forming a spring, in order not to introduce any additional stiffness to the mobile mass.

The operation of the structure in FIG. 1 will now be described by considering a thermal reservoir which exhibits a thermal capacity which is greater than that of the beams 18, 20.

The second linking means, i.e. the two beams 18 and 20 and the thermal reservoir 22 are voltage- or current-polarised.

The beams undergo self-heating by means of the Joule effect.

When the mobile mass 2 is made to move by an external stimulus, for example acceleration, it moves around the Z axis and applies a tensile or compression stress to the beams 18 and 20.

Since at least one of the beams 18, 20 is made of piezoresistive material, the electrical resistance of the beam varies, and then the power is dissipated by the Joule effect, the effect of which is to change the temperature of the beam and more generally of the second linking means.

Since at least one of the linking elements 18, 20 possess thermoelastic properties a back action force is generated by deformation of this element which is applied to the mobile mass.

Far may be described by formula III.

$$F(\omega) = E\alpha R_{th} I^2 \pi_g R \frac{x - j\tau_{th}\dot{x}}{1 + (\omega\tau_{th})^2} \quad \text{(III)}$$

It may be deduced from this that the effect of the force Far is maximum when the time constant reaches a value such that:

$$\tau_{th}\omega_r \sim 1$$

Thanks to the invention, it is possible to regulate the value of $\tau_{Th}$ in order to meet the condition $\tau_{th}\omega_r \sim 1$ without having to modify the resonance frequency value of the structure.

In effect the thermal reservoir 22 increases the thermal inertia of the second means if linking, which has the effect of increasing the thermal time constant. The thermal reservoir, because of its greater thermal capacity Cth than those of the beams, tends to "absorb" more heat than the beams and therefore delays the temperature variation induced by the Joule effect modification due to the movement of the mass.

By increasing the thermal inertia, the mechanical back effects on the structure on which the linking elements rest are delayed. This increase in the thermal inertia is optimised by the fact that the thermal reservoir is linked to the rest of the structure only by the beams, in order to maximise the thermal isolation. The beams are subjected to heating controlled by the thermal reservoir arranged between the beams, the mechanical forces exerted by each beam element on its fixed anchorages are then synchronised.

In an example which is of particular interest, only one of the beams 18, 20 is made of a piezoresistive material and has a low coefficient of expansion i.e. less than $10^{-7}K^{-1}$, and the other beam 20, 18 is not piezoresistive and exhibits thermoelastic properties, i.e. a coefficient of expansion greater than $10^{-7}K^{-1}$. This embodiment optimises the choice of piezoresistive material and of the thermoelastic material in order to best exploit the back action effect.

Figure 3:
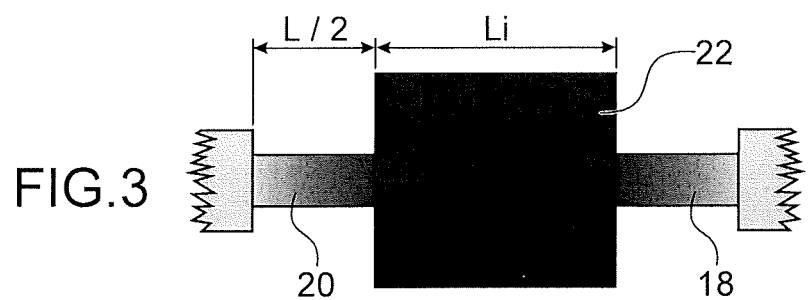
FIG. 3 is a detail view of another example of linking means which may be implemented in the structure according to the invention.
Figure 4:
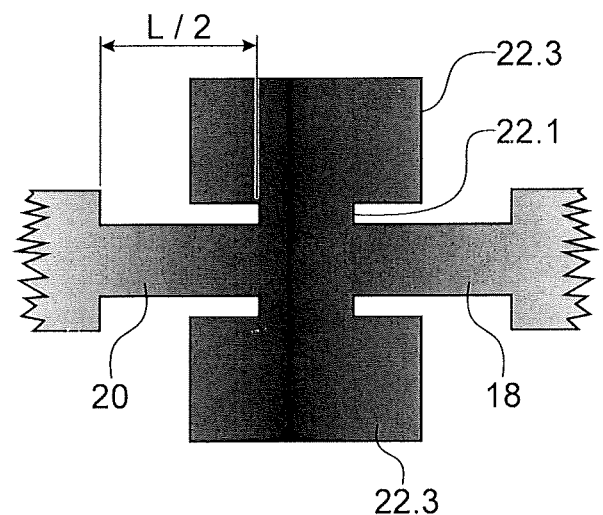
FIG. 4 is a detail view of another example of linking means which may be implemented in the structure according to the invention.

In FIGS. 2 to 4 other embodiment examples of the second linking means can be seen. By way of comparison, a structure can be considered wherein the second linking means would be single beam of length L, linking the mobile part 2 to the second anchorage stud 24.

In the various FIGS. 2 to 4, Li designates the dimension of the thermal reservoir in the X direction.

In FIG. 2 the thermal reservoir 22 has a large dimension in the Y direction and a small dimension in the X direction. Each beam 18, 20 has a length L/2.

In FIG. 3 the thermal reservoir 22 exhibits dimensions which are similar in the X and Y directions, allowing rapid thermalisation of the thermal reservoir 22. Each beam has a length L/2.

In FIG. 4 the thermal reservoir comprises a central portion 22.1 of small dimensions along the X axis and two end portions 22.3 of greater dimensions along the X axis. Each beam has a length L/2. This embodiment has the advantage of being able to retain the second linking means whose total dimension along the X axis is close to the sum of the dimensions along the X axis of the two beams. Thus the incorporation of the thermal reservoir has less impact on the overall dimensions of the structure.

The second linking means of the FIGS. 2 to 4 have a stiffness close to a single beam of length L, which allows the vibration modes of the entire structure to be changed little or not at all. Moreover, the electrical resistance of the thermal reservoir is small. Preferentially, it could be considered that $R_{Rex} < 0.5\ R_{poutre}$, which allows an electrical resistance of the same order of magnitude as that set by the beams 18, 20 of smaller cross-section to be preserved and which is almost the same as or equal to that of a single beam. The increase in the electrical consumption of the structure is therefore limited.

The thermal resistance of the thermal reservoir is preferably low, it is advantageously at its maximum three times smaller than the thermal resistance of the beams, and preferably 5 times smaller than the thermal resistance of the beams, which favours rapid distribution of the thermal energy to the plate and not to the anchorages of the beams at the second stud.

For a given thermal reservoir volume, a reservoir with a compact three-dimensional form is preferred in order to promote the rapid distribution of energy within this plate.

Figure 6:
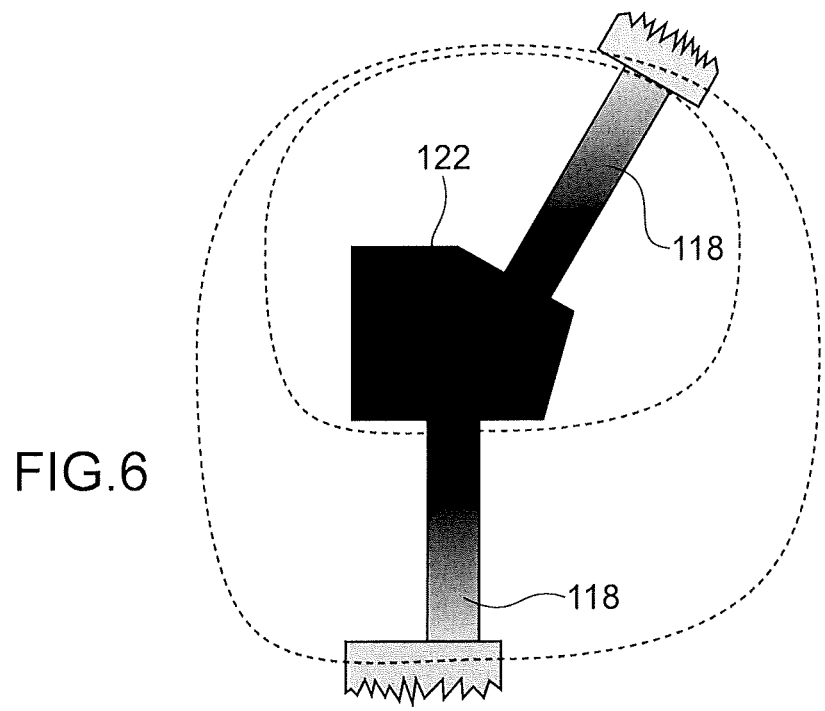
FIG. 6 is a detail view of another example of linking means which may be implemented in the structure according to the invention.

In FIG. 6 another embodiment example of the second linking means can be seen wherein the linking elements 118, 120 are not parallel and are not aligned. The thermal reservoir 122 has a pentagonal form.

As regards the linking elements, they are preferably formed by rectilinear beams but it may be envisaged that they comprise several portions of beams whose axes form an angle with each other. Small angles are chosen so that the back action in the second linking means preferably serve to apply a force to the anchorages and not to deform the linking elements.

Figure 5A:
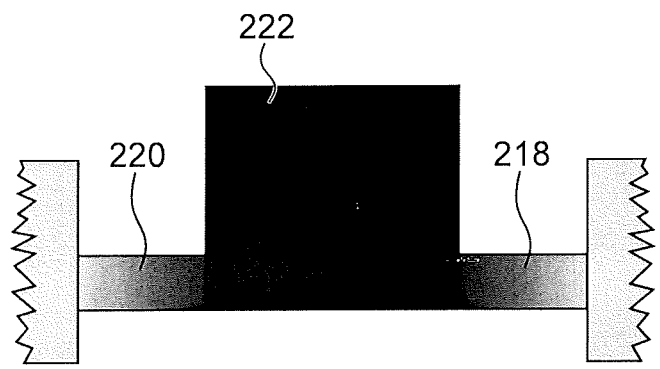
FIG. 5A is a detail view of another example of linking means which may be implemented in the structure according to the invention.

Yet another embodiment example of the second linking means can be seen in FIG. 5A, wherein the linking elements 218, 220 are connected to the thermal reservoir 222 on an edge of the latter and not in the central part of the latter. The second linking means have no plane of symmetry containing X and Z.

Figure 5B:
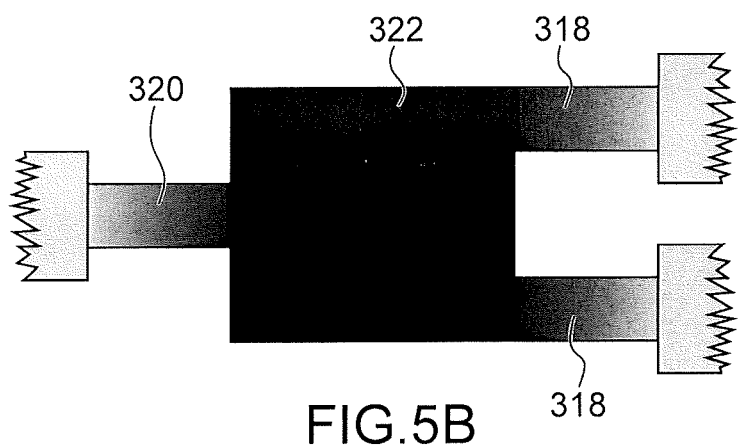
FIG. 5B is a detail view of another example of linking means which may be implemented in the structure according to the invention.

In FIG. 5B yet another embodiment example of the second linking means can be seen comprising several first linking elements 318 and a second linking element 320 linked to the thermal reservoir 322. It may be envisaged that they alternatively or moreover comprise several second linking elements 320.

In another advantageous embodiment example, the replacement of the beams forming the linking elements by beams of sub-micrometric cross-section may be envisaged, more particularly with nanowires whose dimensions in a plane perpendicular to their length are less than about 500 nm, in which the sum of the cross-sections of all the nanowires would be similar to or the same as that of the beam 18 or 20. The thermal resistance of the linking elements is then advantageously increased. Indeed the thermal conductivity of nanowires made of silicon falls by several orders of magnitude at these dimensions. It is therefore possible to create a structure with the same stiffness and the same electrical resistance and increased thermal resistance. This increase in the thermal resistance favours the removal of thermal energy towards the plate and not to the anchorages of the beams at the second anchorage stud and to the mass.

This ability to increase the thermal resistance provides an additional degree of freedom for modifying the thermal time constant. The number of embodiment possibilities for the structures that can be made is therefore increased.

Figure 7:
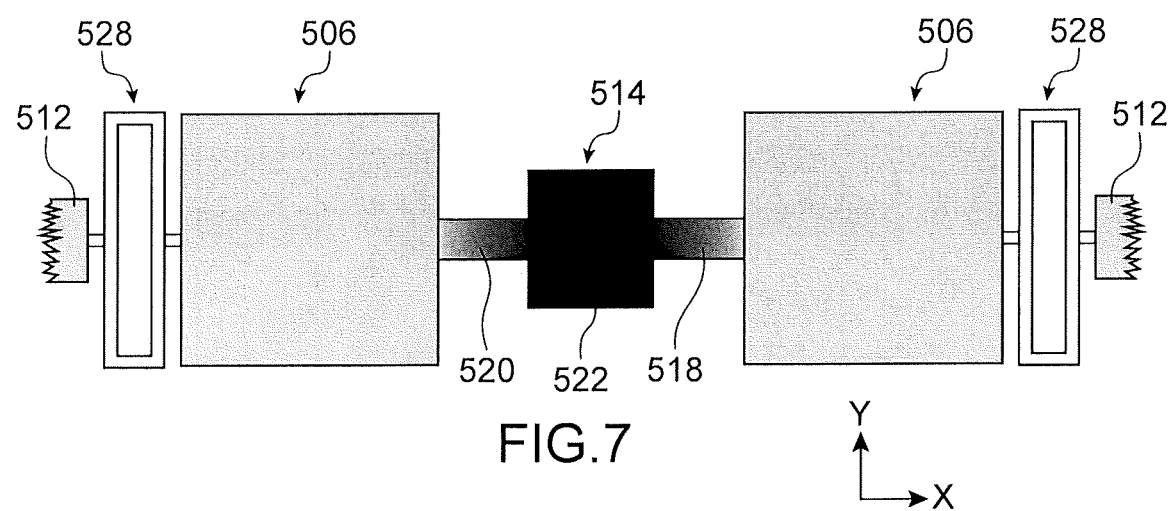
FIG. 7 is a schematic representation of another embodiment example of a microelectronic structure according to the invention.

In FIG. 7 another example of a microelectronic structure according to the invention can be seen.

This structure differs from that of FIG. 1 in that on the one hand it comprises two mobile masses 506 linked by second linking means 514 according to the invention comprising a thermal reservoir 522 and two beams 518, 520. Moreover the mobile masses 506 are suspended at anchorage studs 512, 524 by springs 528 allowing the mobile masses to move in the plane along the X axis and to vibrate in phase opposition. The thermal reservoir is then immobile along the X axis which means that the dimensions of the thermal reservoir are not restricted.

The structure has a vibration mode for which the two masses vibrate in phase opposition. For this mode the mass of the thermal reservoir may be any value whatsoever since its inertia plays no part in the properties of the mode (inertia, resonance frequency).

It should be noted that a structure wherein the two mobile masses are in phase applies no deformation to the linking elements and is not subject to a back action effect.

The mass may have any movement, linear movements or rotation. Furthermore the movements may in-plane movements, out-of-plane movements and/or a combination of in-plane movements and out-of-plane movements.

In general the thermal reservoir may contribute to the overall inertia of the MEMS or of the NEMS. This may modify the resonance frequency of the system, for example. Preferably a way is sought to obtain a negligible mass of the thermal reservoir relative to the rest of the structure, for example a mass of less than 20% of the mass of the structure. This is the case, for example, in the structure of FIG. 2.

In the examples described the second linking means comprise a thermal reservoir but it may be envisaged that they comprise several thermal reservoirs, for example two thermal reservoirs linked by a beam, where the second linking means then comprise three beams and two thermal reservoirs.

Thanks to the invention, the thermal time constant for the system of beams which generates the back action effect may be chosen by designing the dimensions of the thermal reservoir or reservoirs, by modifying very slightly the mechanical parameters associated with the MEMS (stiffness, mechanical inertia etc.) and the electrical resistances associated with the back action beams. Thus it is possible to create a structure which fulfills or at least comes close to meeting the condition $\tau_{th}\omega_r \sim 1$ for which control over the viscous dissipation force is most favourable.

The thermal inertia may be modified by from 1 to 3 orders of magnitude i.e. multiplied by a factor between 10 and 1000 by extending the thermal reservoir in directions transverse to the main direction of the beams. For example let us consider a beam of length 5 µm and of width and thickness 250 nm, its thermal inertia may be increased by at least a factor of 100 by inserting a thermal reservoir of dimensions 5 µm×2.5 µm×2.5 µm between two half-beams.

The thermo-piezoresistive back action effect changes the mechanical response of a MEMS/NEMS resonator without modifying the force noise of a thermal origin, in contrast to pneumatic damping systems (control of the pressure in the MEMS/NEMS cavity). In the case of active damping systems, complex electronics must be used: reintroducing measurement noise into the back action force generates force noise in the MEMS, which could reduce its level of performance.

The present invention is particularly effective for working frequencies at which the major part of the kinetic energy of the microelectronic structure is located in the mobile mass, preferably at least 70%.

In the case of the structure in FIG. 2, the working frequencies may be between 1 kHz and 100 kHz, for example between 3 kHz and 20 kHz.

In the case of the structure in FIG. 7, the working frequencies may be of the order of 1 MHz, or even a few tens of MHz, without this being restrictive.

Solely by way of an example, the thermal time constant of a structure according to the invention will be estimated. The second linking means comprise:

two beams of length 2.5 µm and of cross-section 250×250 nm² made of silicon, a thermal reservoir of dimensions 5×5 µm² and of thickness 250 nm also made of silicon.

The thermal capacity per unit mass of the silicon is close to that of bulk silicon, at 700 J/kg. The thermal conductivity is taken as being equal to 80 W/m/K for p doped silicon at a level of $5.10^{-19}$ cm$^{-3}$ due to the small cross-section of the beam. In the case of bulk silicon, the thermal conductivity is equal to 148 W/m/K.

By considering a simplified model, which concentrates the thermal inertia in the thermal reservoir and the thermal resistance in the beams, an estimate of the thermal time constant can be made. This model seems reasonable considering the differences in dimensions between these elements:

The thermal resistance of the system connected to the exterior by the two beams is estimated at 0.25 MK/W. The two beams are in parallel from a thermal point of view $$R_{th} = \frac{1}{2}\frac{L}{\gamma_{th}S}$$

As for the thermal capacity of the thermal reservoir this is estimated at 10.2 pJ/K.

A thermal constant of the order of 2.5 µs is estimated. In the absence of a thermal reservoir (the second linking elements would comprise only a beam of length 5 µm and of width and thickness 250 nm) a time constant in the 50 ns range is nearly two orders of magnitude less. If the thickness of the thermal reservoir is set to 2.5 µm, the time constant can reach 25 µs, that is, nearly three orders of magnitude higher than the beam alone.

To approach the condition $\tau_{th}\omega_r \sim 1$, with a time constant of 25 µs, the resonance frequency range of the MEMS/NEMS structure that can be addressed with a beam of dimension 5 µm×250×250 nm² is between 7 kHz and 3.5 MHz: these orders of values are compatible with numerous MEMS/NEMS applications such as gyrometers, accelerometers etc. By using beams of smaller dimensions, the effect may be applied for frequencies in the range of from ten or so to a hundred or so MHz.

We will now describe such an embodiment method for a structure according to the present invention, the various steps in which can be seen schematically represented in the various steps in FIG. 8A to 8F.

An SOI (silicon on insulator) structure is used for example which comprises a substrate 402, a buried oxide BOX layer 404 and a layer of silicon 406. The silicon layer has for example a thickness of the order of 200 nm. In general the layer may be of Si, SiGe or Ge, poly or monocrystalline.

Structuring of silicon layer 406 is then carried out for example by photolithography and etching with a stop on the oxide layer 406, allowing the linking means to be defined.

Figure 8A:
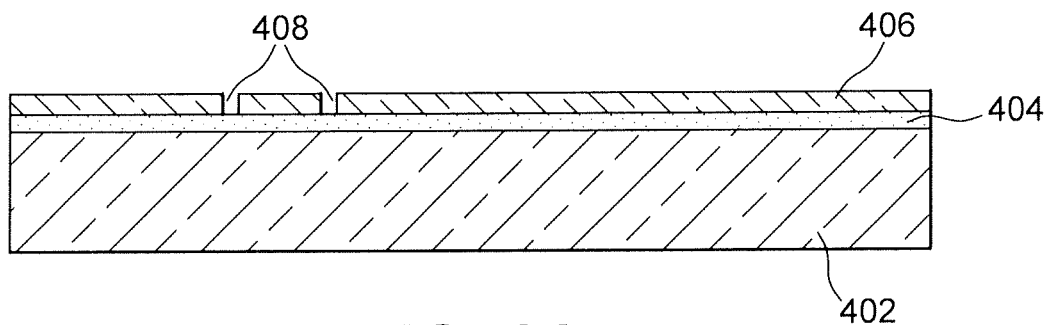
FIGS. 8A to 8F are schematic representations of different steps of an example of method of making a microelectronic structure according to the present invention.

The element thereby obtained is shown in FIG. 8A.

During a subsequent step, deposition of a layer of oxide 410 is carried out on the silicon layer 406 to fill the previously etched zones 408, etching of the oxide layer 410 is then carried out to leave only a portion of the oxide deposited on the silicon layer 406 and linking the oxide filling the trenches. The etching may be performed by dry etching with stopping on the Si or by wet etching, for example using a solution based on sulphuric acid. In the case where the thermal reservoir has a thickness that is different from that of the linking elements, the zone intended to form the thermal reservoir may be envisaged.

Figure 8B:
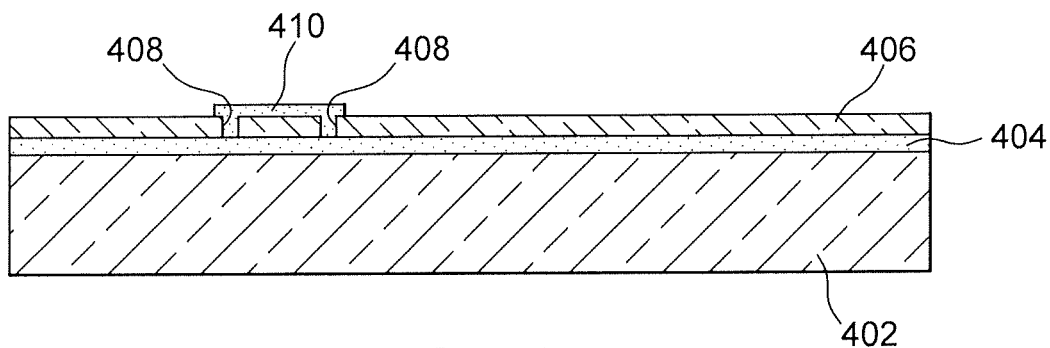

The element thereby obtained is shown in FIG. 8B.

During a subsequent step a deposit of a layer of silicon is formed 412. The layer 412 is obtained for example using epitaxial growth, and has a typical thickness of 1 to 50 µm, for example 10 µm. More generally the layer 412 may be made of Si, SiGe, Ge, poly or monocrystalline or from a metallic material; the deposition may be performed by epitaxy or by methods of the vapour phase physical/chemical deposition type (PVD/CVD: Physical/Chemical Vapour Deposition).

Figure 8C:
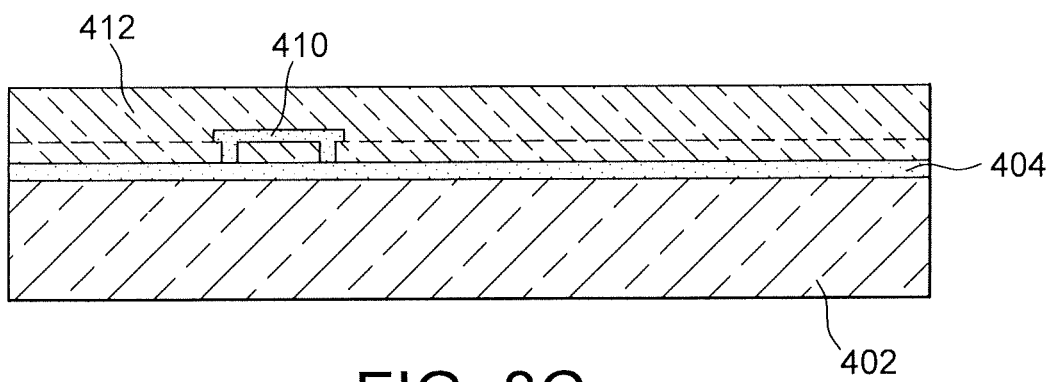

The element thus obtained is shown in FIG. 8C.

Electrical contexts are made during a subsequent step 414. To do this, deposition of a metal layer (AlSi or Au for example) is carried out, and the zones to be removed and to be retained are distinguished using photolithography. Then etching using dry etching is carried out with stopping on Si or by selective wet etching relative to the Si of the metallic layer in order to retain only the contacts 414.

Figure 8D:
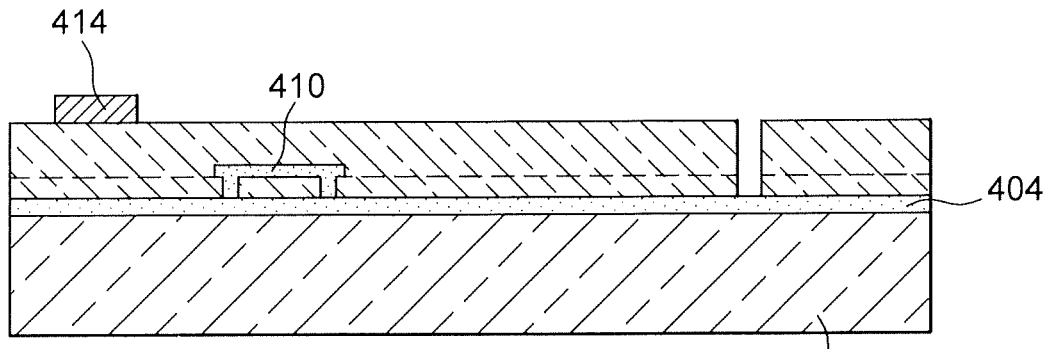

The element thus obtained is shown in FIG. 8D.

During a subsequent step the layers of silicon 406 and 412 are structured in order to define the mobile mass and the first linking means and the second linking means, for example by photolithography and deep etching with stopping on the oxide layers 404 and 410.

Figure 8E:
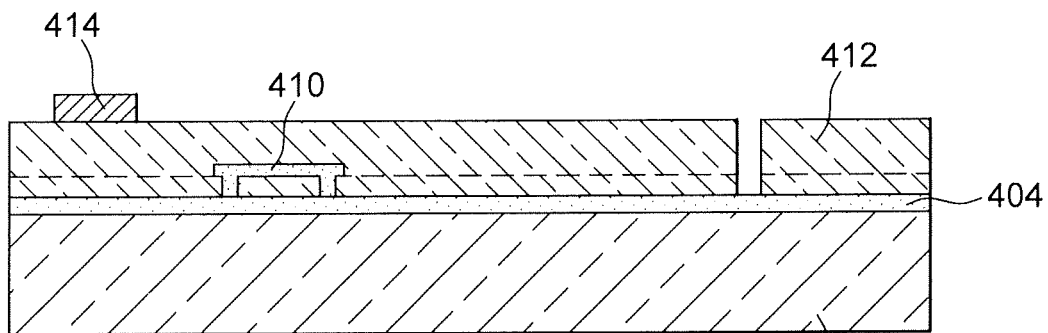

The element thus obtained is shown in FIG. 8E.

During a subsequent step, the mobile mass and the first and second linking means are released, for example using wet etching of the oxide 404 for example using liquid and/or vapour hydrofluoric acid (HF). This is an etching over time. The hydrofluoric acid is left in contact with the oxide layer for the length of time necessary to release the mobile mass and the first and second linking means whilst leaving the oxide layer between the substrate and the fixed parts.

Figure 8F:
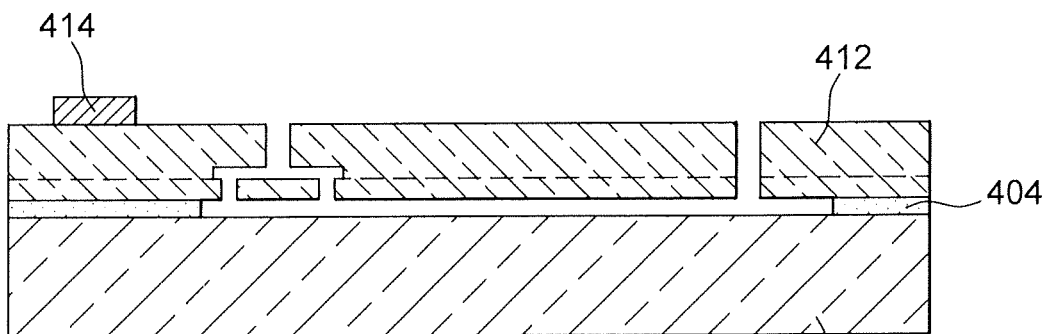

The element thus obtained is shown in FIG. 8F.

The MEMS/NEMS micro- and nanostructures according to the invention which offer means of control of the viscous damping may, for example, be used in MEMS/NEMS micro-sensors and micro-actuators.

The invention claimed is:

1. A resonant microelectronic structure comprising:
at least one mobile mass mechanically linked to at least one first mechanical element and a second mechanical element which are distinct, by a first mechanical linking device and a second mechanical linking device respectively, the mobile masse being configured to vibrate under the action of an external stimulus,
a source of polarisation of current or voltage of the second mechanical linking device, wherein the second mechanical linking device comprises at least one first and one second linking element and at least one thermal reservoir inserted between the first and second linking elements, at least one of the first and second linking elements being made at least in part of a piezoresistive material, where at least one of the first and second linking elements exhibit thermoelasticity properties, and the thermal reservoir exhibiting a thermal capacity which is different from those of the first and second linking elements, wherein the second linking device and the mobile mass are arranged relative to each other such that a displacement of the mobile mass applies a mechanical stress to the second linking device.

2. The resonant microelectronic structure according to claim 1 wherein the thermal capacity of the thermal reservoir is greater than those of the first and second linking elements.

3. The resonant microelectronic structure according to claim 1, wherein the thermal reservoir has a transverse cross-section of surface area which is different to that of the transverse cross-sections of the first and second linking elements.

4. The resonant microelectronic structure according to claim 1, wherein the thermal reservoir is made from at least one material which exhibits a thermal capacity which differs from those of the materials of the first and second linking elements.

5. The resonant microelectronic structure according to claim 1, wherein at least one linking element exhibiting thermoelastic properties is made from at least one material which has an expansion coefficient greater than $10^{-7}K^{-1}$.

6. The resonant microelectronic structure according to claim 1, wherein at least one of the first and the second linking element is made of at least one piezoresistive material which has a coefficient of expansion of less than $10^{-7}K^{-1}$ and at least one of the first and second linking elements is made of at least one non-piezoresistive material which has a coefficient of expansion greater than $10^{-7}K^{-1}$.

7. The resonant microelectronic structure according to claim 1, wherein the first and second linking elements each comprise at least one straight beam.

8. The resonant microelectronic structure according to claim 1, wherein at least one of the first and second linking elements comprise at least one nanowire.

9. The resonant microelectronic according to claim 1, wherein the stiffness of the first and second linking elements and of mechanical connections between the first linking element and the mobile mass and between the second linking element and the second mechanical element are such that expansion of the second linking device primarily causes a force on the mobile mass.

10. The resonant microelectronic structure according to claim 1, wherein the capacity of the thermal reservoir is chosen such that the second linking device exhibits a thermal time constant $\tau_{th}$ such that $\tau_{th}\omega_r \sim 1$ where $\omega_r$ is a resonance frequency of the microelectronic structure.

11. The resonant microelectronic structure according to claim 1, wherein the first and second linking elements extend along a first direction, wherein the thermal reservoir comprises a central zone linked to the first and second linking elements of given cross-section in the first direction and lateral zones in a second direction transverse to the first direction, said lateral zones having a dimension in the first direction which is greater than said given cross-section of the central zone.

12. The resonant microelectronic structure according to claim 1, wherein the source of polarisation is connected between the first mechanical element and the second mechanical element, the first and second linking devices and the mobile mass being all or partly electrically conductive.

13. The resonant microelectronic structure according to claim 1, wherein the thermal reservoir exhibits a thermal resistance at most three times smaller than the thermal resistances of the linking elements.

14. The resonant microelectronic structure according to claim 1, wherein the first mechanical element is an anchorage stud, firmly attached to a support and the mobile mass is pivoted so that it rotates relative to the anchorage stud and wherein the second mechanical element is a second anchorage stud firmly attached to the support.

15. The resonant microelectronic structure according to claim 1, wherein the first mechanical element is an anchorage stud firmly attached to a support and the mobile mass can move in translation along a direction relative to the support and wherein the second mechanical element comprises a mass which can move in translation relative to the support along said direction, with the two mobile masses being in phase opposition.

16. The resonant microelectronic structure according to claim 1, wherein the thermal capacity of the thermal reservoir is equal to at least 5 times the thermal capacity of each linking element.

17. The resonant microelectronic structure according to claim 1, wherein the first and second linking elements are made of silicon and the thermal reservoir is made of an alloy of aluminium or of beryllium.

* * * * *